US010515856B2

(12) United States Patent
Lin et al.

(10) Patent No.: US 10,515,856 B2
(45) Date of Patent: *Dec. 24, 2019

(54) METHOD OF MAKING A FINFET, AND FINFET FORMED BY THE METHOD

(71) Applicant: Taiwan Semiconductor Manufacturing Co., Ltd., Hsin-Chu (TW)

(72) Inventors: Chia-Pin Linus Lin, Xinpu Township (TW); Chien-Tai Chan, Hsinchu (TW); Hsien-Chin Lin, Hsinchu (TW); Shyue-Shyh Lin, Zhubei (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

This patent is subject to a terminal disclaimer.

(21) Appl. No.: 16/271,522

(22) Filed: Feb. 8, 2019

(65) Prior Publication Data

US 2019/0181048 A1 Jun. 13, 2019

Related U.S. Application Data

(60) Continuation of application No. 15/076,762, filed on Mar. 22, 2016, now Pat. No. 10,224,245, which is a
(Continued)

(51) Int. Cl.
*H01L 29/76* (2006.01)
*H01L 21/8234* (2006.01)
(Continued)

(52) U.S. Cl.
CPC ........... *H01L 21/823431* (2013.01); *H01L 21/823412* (2013.01); *H01L 21/823807* (2013.01);
(Continued)

(58) Field of Classification Search
CPC ............ H01L 21/823807; H01L 21/823412
See application file for complete search history.

(56) References Cited

U.S. PATENT DOCUMENTS 6,706,571 B1 3/2004 Yu et al.
6,815,738 B2 11/2004 Rim
(Continued)

FOREIGN PATENT DOCUMENTS

JP 2006507681 A 3/2006
JP 2007207837 8/2007
(Continued)

OTHER PUBLICATIONS

Official Action issued by the Korean Patent Office (KIPO) dated Aug. 2, 211 in counterpart Korean patent application.
(Continued)

*Primary Examiner* — Samuel A Gebremariam
(74) *Attorney, Agent, or Firm* — Duane Morris LLP

(57) ABSTRACT

A method includes forming first and second fins of a finFET extending above a semiconductor substrate, with a shallow trench isolation (STI) region in between, and a distance between a top surface of the STI region and top surfaces of the first and second fins. First and second fin extensions are provided on top and side surfaces of the first and second fins above the top surface of the STI region. Material is removed from the STI region, to increase the distance between the top surface of the STI region and top surfaces of the first and second fins. A conformal stressor dielectric material is deposited over the fins and STI region. The conformal dielectric stressor material is reflowed, to flow into a space between the first and second fins above a top surface of the STI region, to apply stress to a channel of the finFET.

20 Claims, 8 Drawing Sheets

Related U.S. Application Data division of application No. 12/725,554, filed on Mar. 17, 2010, now Pat. No. 9,312,179.

(51) Int. Cl.
*H01L 29/78* (2006.01)
*H01L 29/06* (2006.01)
*H01L 29/08* (2006.01)
*H01L 29/161* (2006.01)
*H01L 21/8238* (2006.01)
*H01L 29/66* (2006.01)
H01L 29/165 (2006.01)

(52) U.S. Cl.
CPC .. *H01L 21/823821* (2013.01); *H01L 29/0653* (2013.01); *H01L 29/0847* (2013.01); *H01L 29/161* (2013.01); *H01L 29/66795* (2013.01); *H01L 29/785* (2013.01); *H01L 29/7843* (2013.01); *H01L 29/7846* (2013.01); *H01L 29/7848* (2013.01); *H01L 29/7851* (2013.01); *H01L 29/165* (2013.01)

(56) References Cited

U.S. PATENT DOCUMENTS

| | | | |
|---|---|---|---|
| 6,858,478 | B2 | 2/2005 | Chau et al. |
| 6,969,659 | B1 | 11/2005 | Anderson et al. |
| 7,122,412 | B2 | 10/2006 | Chen et al. |
| 7,190,050 | B2 | 3/2007 | King et al. |
| 7,247,887 | B2 | 7/2007 | King et al. |
| 7,265,008 | B2 | 9/2007 | King et al. |
| 7,355,233 | B2 | 4/2008 | Liaw |
| 7,508,031 | B2 | 3/2009 | Liu et al. |
| 7,528,465 | B2 | 5/2009 | King et al. |
| 7,564,081 | B2 | 7/2009 | Zhu et al. |
| 7,605,449 | B2 | 10/2009 | Liu et al. |
| 7,915,693 | B2 | 3/2011 | Okano |
| 8,039,843 | B2 | 10/2011 | Inaba |
| 8,338,889 | B2 | 12/2012 | Kaneko et al. |
| 10,224,245 | B2 * | 3/2019 | Lin ................ H01L 21/823412 |
| 2004/0195624 | A1 | 10/2004 | Liu et al. |
| 2004/0256647 | A1 | 12/2004 | Lee et al. |
| 2005/0153490 | A1 | 7/2005 | Yoon et al. |
| 2005/0242396 | A1 | 11/2005 | Chen et al. |
| 2006/0084211 | A1 | 4/2006 | Yang et al. |
| 2006/0197161 | A1 | 9/2006 | Takao |
| 2007/0060326 | A1 | 3/2007 | Chen et al. |
| 2007/0063261 | A1 | 3/2007 | Chen et al. |
| 2007/0076477 | A1 | 4/2007 | Hwang et al. |
| 2007/0080387 | A1 | 4/2007 | Liu et al. |
| 2007/0120154 | A1 | 5/2007 | Zhu et al. |
| 2007/0120156 | A1 | 5/2007 | Liu et al. |
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0210355 | A1 | 9/2007 | Izumida |
| 2007/0228372 | A1 | 10/2007 | Yang et al. |
| 2007/0241399 | A1 | 10/2007 | Irisawa et al. |
| 2008/0006908 | A1 | 1/2008 | Lin et al. |
| 2008/0290470 | A1 | 11/2008 | King et al. |
| 2008/0296632 | A1 | 12/2008 | Moroz et al. |
| 2008/0296702 | A1 | 12/2008 | Lee et al. |
| 2009/0026505 | A1 | 1/2009 | Okano |
| 2009/0181477 | A1 | 7/2009 | King et al. |
| 2009/0230478 | A1 | 9/2009 | Pillarisetty et al. |

FOREIGN PATENT DOCUMENTS

| | | |
|---|---|---|
| JP | 200932955 | 2/2009 |
| JP | 200954705 | 3/2009 |
| WO | 20040949406 A1 | 6/2004 |

OTHER PUBLICATIONS

Official Action dated Jan. 22, 2013, in counterpart Japanese patent application.
Official Action dated Nov. 4, 2014, in counterpart Japanese patent application No. 2013-201824.

* cited by examiner

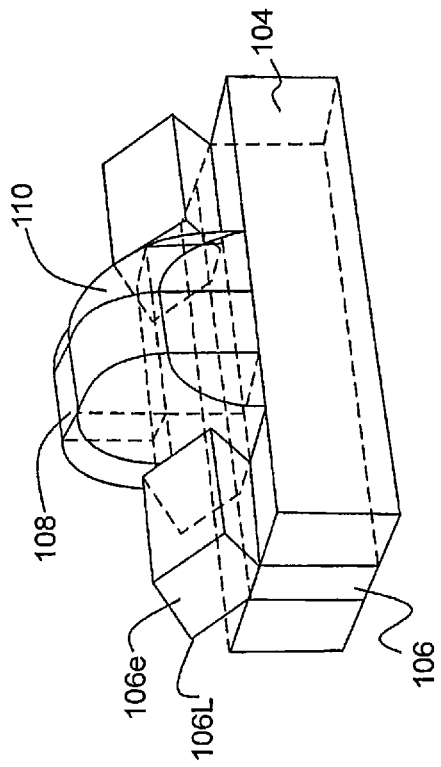
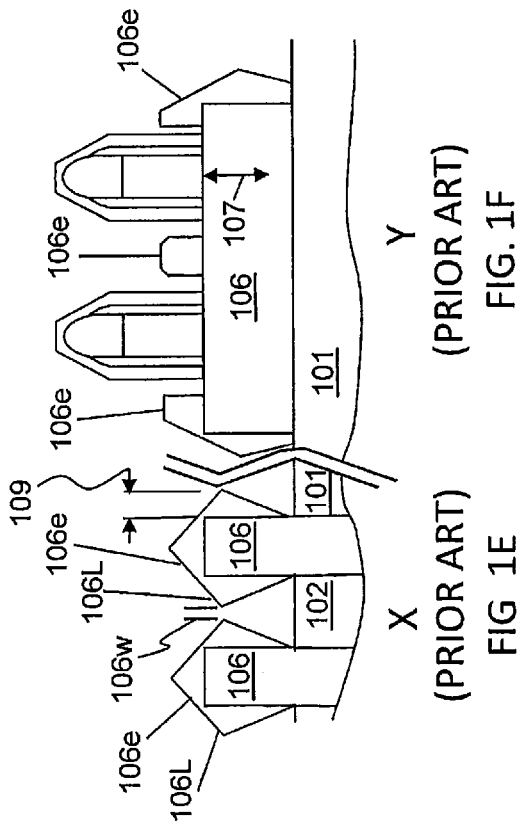
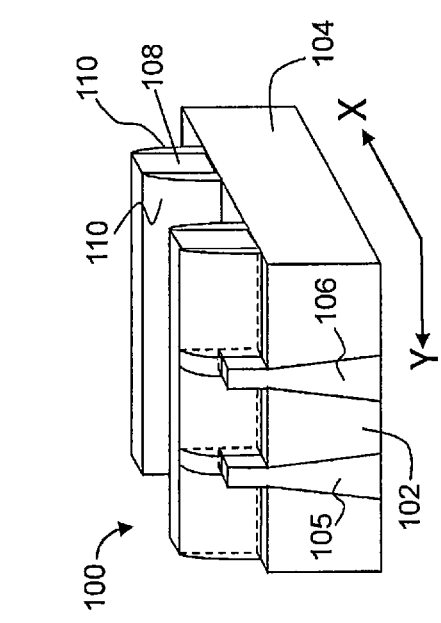
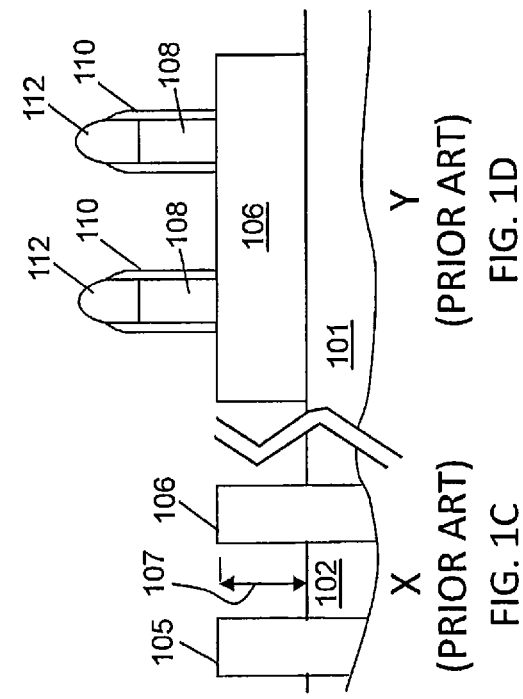

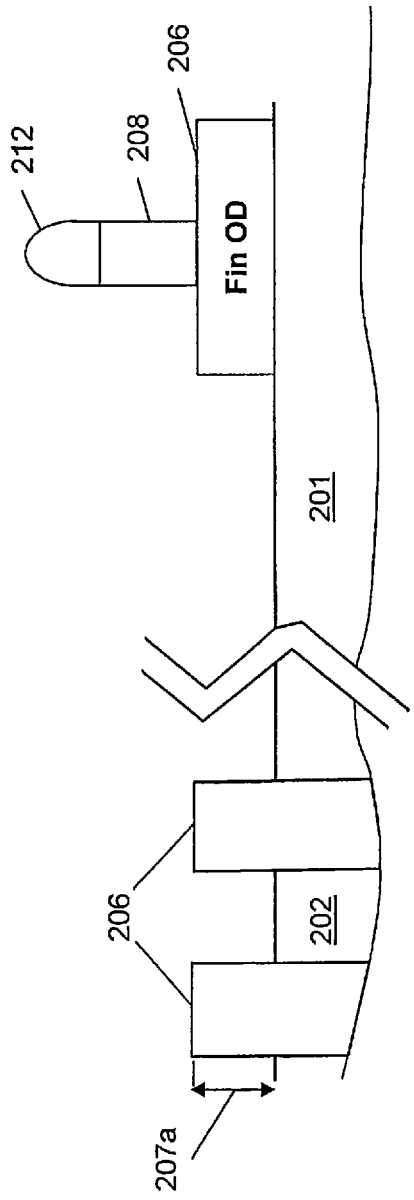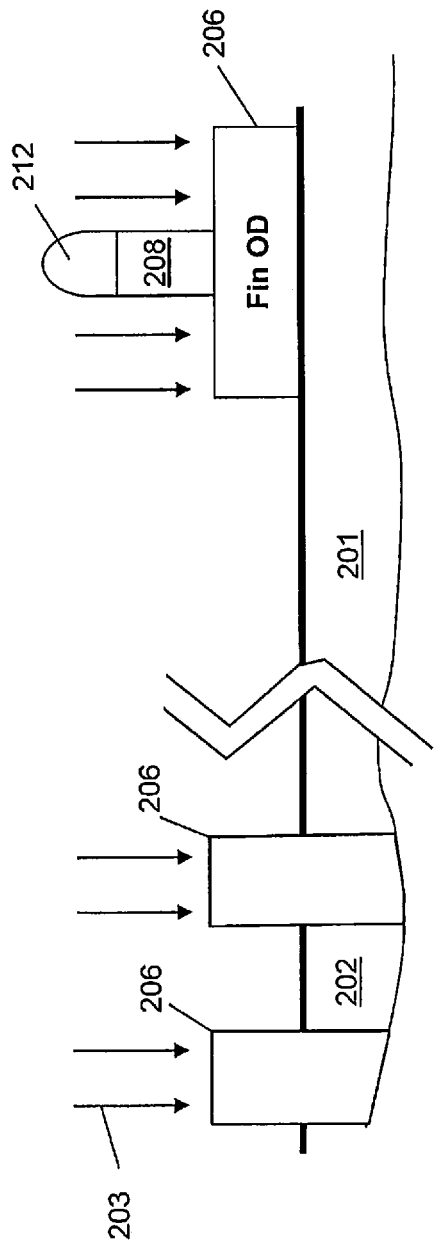

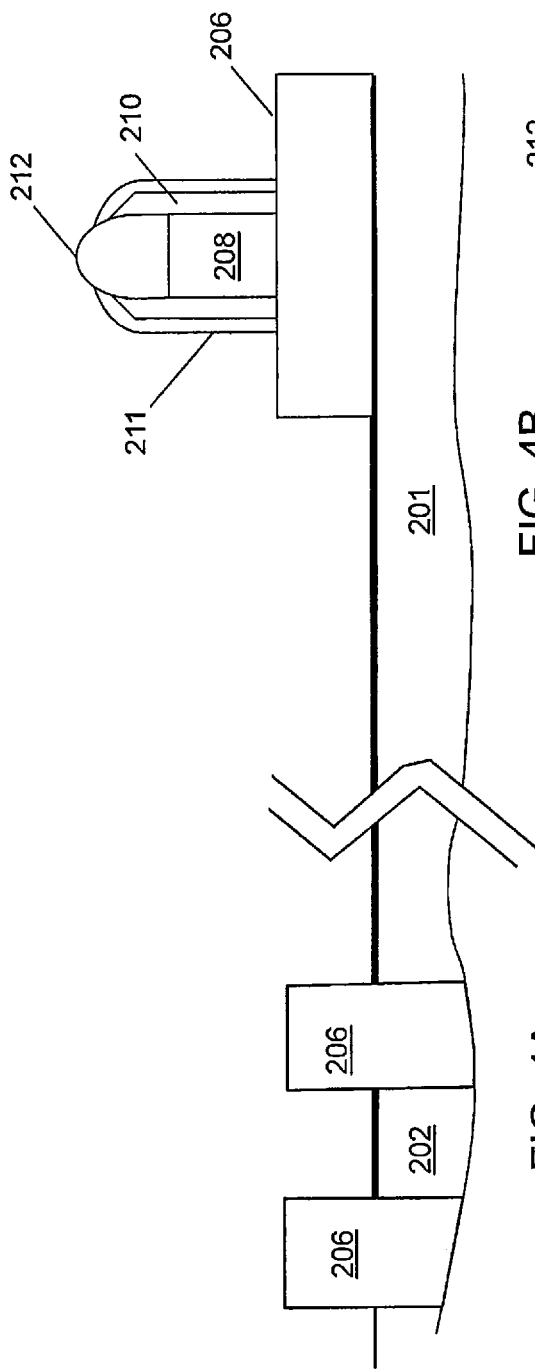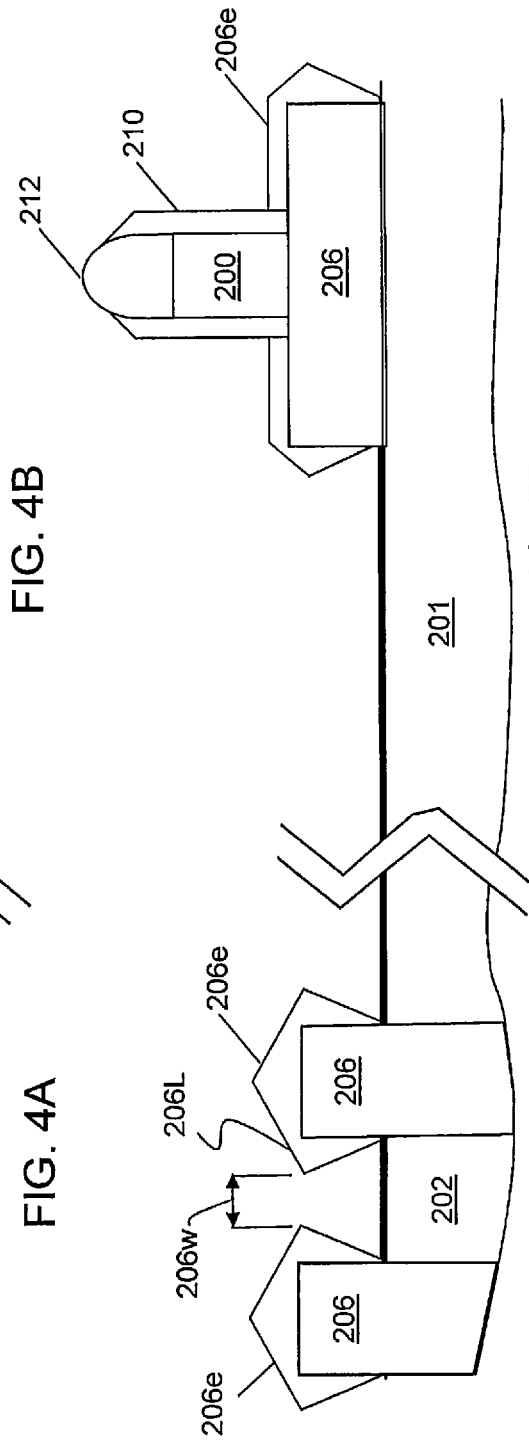

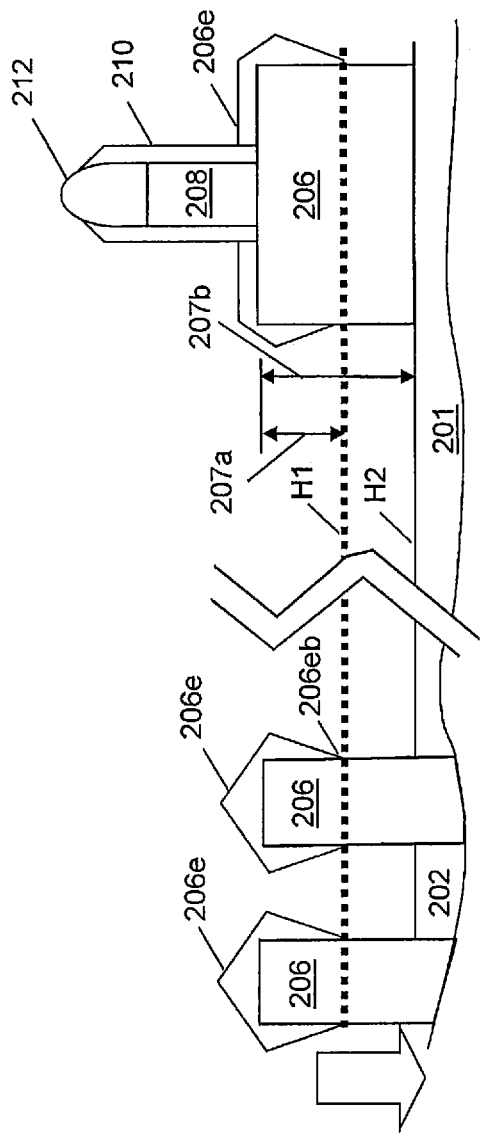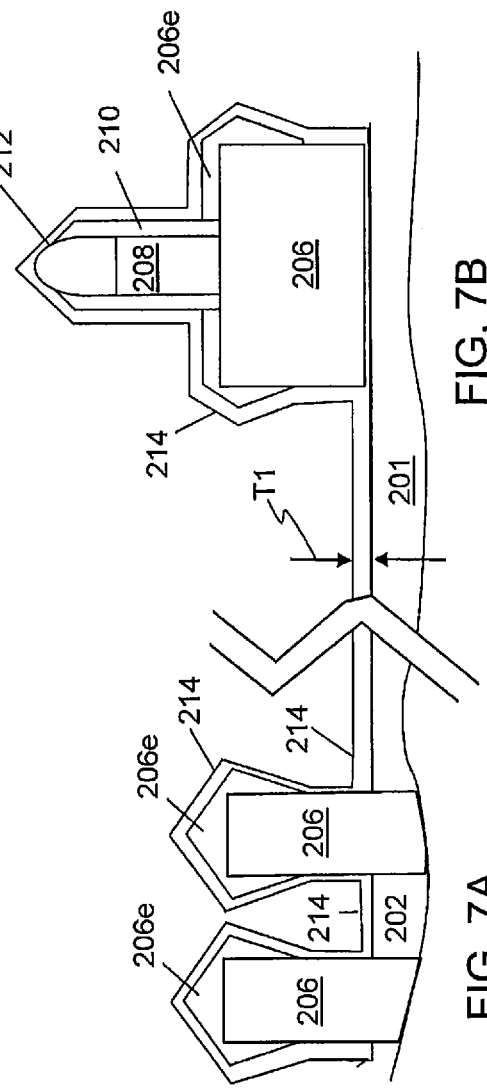

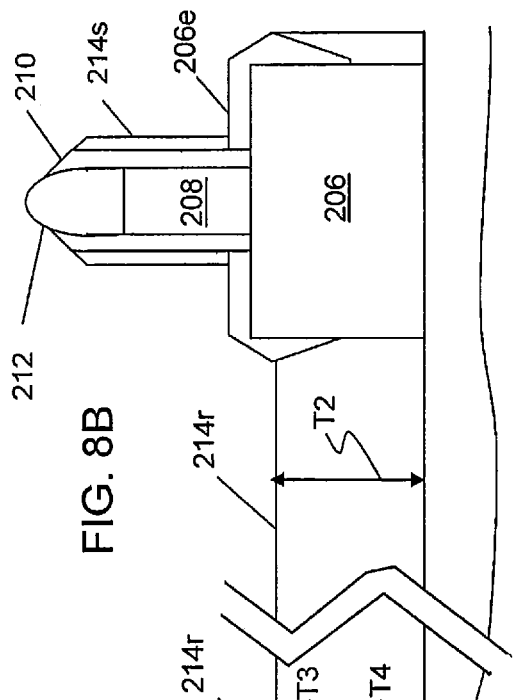
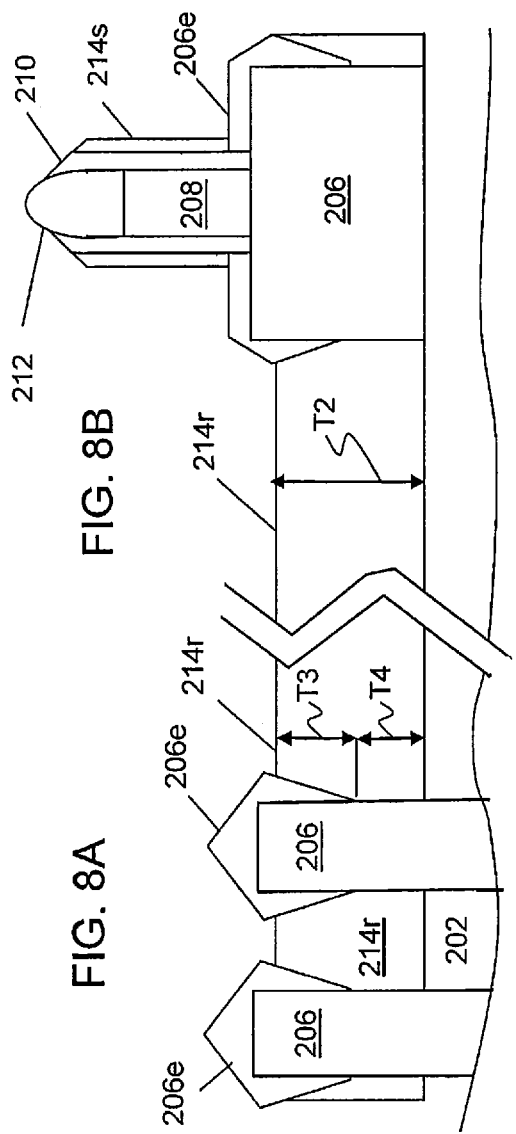
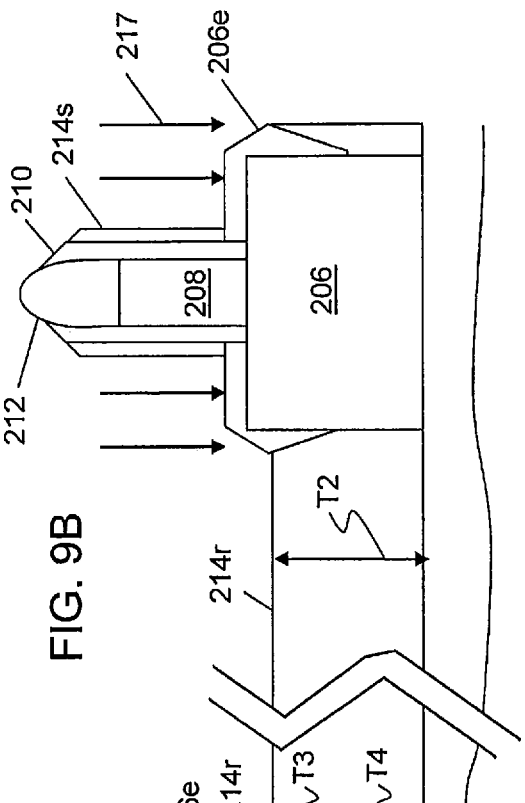
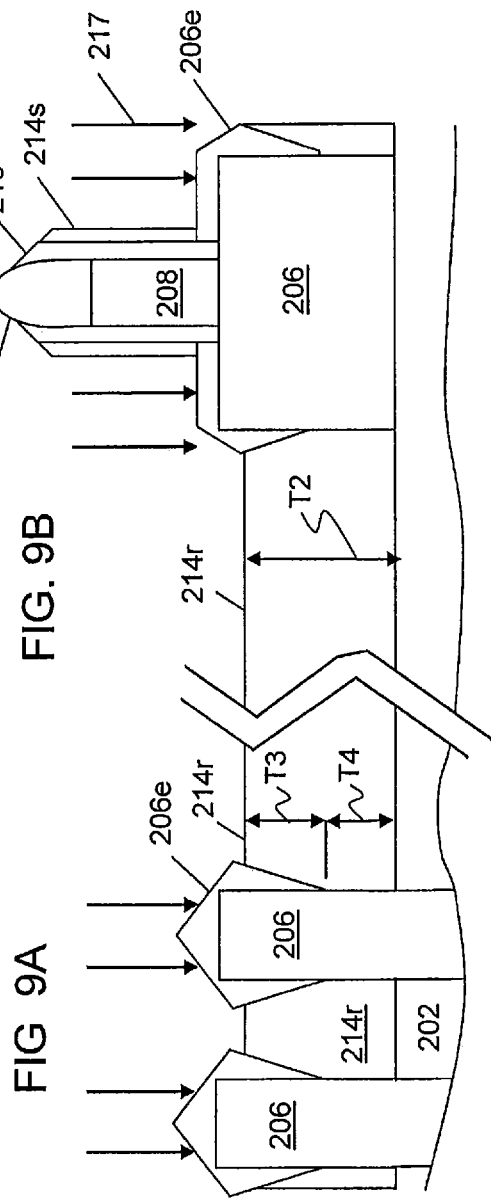

METHOD OF MAKING A FINFET, AND FINFET FORMED BY THE METHOD

CROSS-REFERENCE TO RELATED APPLICATIONS

The present application is a continuation of U.S. patent application Ser. No. 15/076,762, filed Mar. 22, 2016, which is a division of U.S. patent application Ser. No. 12/725,554, filed Mar. 17, 2010, each of which is expressly incorporated by reference herein in its entirety.

FIELD OF THE INVENTION

The present subject matter relates generally to semiconductor fabrication, and more specifically to fin field effect transistors (finFETs), and their fabrication.

BACKGROUND

In the rapidly advancing semiconductor manufacturing industry, CMOS, complementary metal oxide semiconductor, FinFET devices are favored for many logic and other applications and are integrated into various different types of semiconductor devices. FinFET devices typically include semiconductor fins with high aspect ratios and in which channel and source/drain regions of semiconductor transistor devices are formed. A gate is formed over and along the sides of the fin devices utilizing the advantage of the increased surface area of the channel and source/drain regions to produce faster, more reliable and better-controlled semiconductor transistor devices.

In FinFET and conventional planar transistor devices, a compressive stress applied to a PMOS device advantageously enhances hole mobility. Similarly, tensile stress applied to NMOS devices advantageously enhances electron mobility in the NMOS device. For planar CMOS devices, complex stressors such as selective SiGe source/drain structures are used to enhance hole mobility in PMOS devices and tensile contact etch stop layers, contact etch stop layer (CESL), or other dielectric film stressors are used to enhance electron mobility for NMOS devices to enhance overall device performance. The additional processing operations and costs associated with these techniques for enhancing hole and electron mobility are among the challenges associated with attempting to integrate these techniques into FinFET processing schemes.

FIG. 1A is an isometric view of a conventional finFET 100. The fins 106 comprise raised oxide defined (OD) regions 106 above a semiconductor substrate 101 (shown in FIGS. 1C, 1D). Fins 106 are separated from each other by a shallow trench isolation (STI) region 102, and are located between a pair of STI regions 102. The fins 106 have a step height 107 above the top surface of the STI regions 102. Polycrystalline silicon gate electrodes 108 are formed over the fins 106, with a thin gate dielectric layer (not shown) in between. Sidewall spacers 110 are formed on both sides of each gate electrode 110, for forming lightly doped drain (LDD) implant regions (not shown).

FIG. 1B shows one of the fins 106 after an epitaxial growth step raises the surface 106e of the fin 106. The top portion 106e of the fin 106 acquires an approximately pentagonal shape, with lateral extensions 106L that extend a distance 109 parallel to the direction of the top surface of the substrate 101.

FIGS. 1C and 1D show the X-direction (front) and Y-direction (side) elevation views of the finFET 100 of FIG. 1A, after formation of the silicon oxide hard mask 112 and dummy side wall spacers 110, but before the epitaxial SiGe formation.

FIGS. 1E and 1F show the X-direction (front) and Y-direction (side) elevation views of the finFET 100 of FIG. 1A, after performing epitaxial processing. An epitaxial process is performed on the fins 106, forming a SiGe layer 106e over the fin 106 of the finFET.

As shown in FIG. 1E, the epitaxial SiGe lateral extensions 106L of fin SiGe layers 106e extend laterally towards each other, reducing the window 106w between adjacent fin side extensions 106L.

SUMMARY OF THE INVENTION

In some embodiments, a method comprises forming first and second fins of a finFET extending above a semiconductor substrate, with a shallow trench isolation (STI) region therebetween, and a distance between a top surface of the STI region and top surfaces of the first and second fins. First and second fin extensions are provided on top and side surfaces of the first and second fins above the top surface of the STI region. Material is removed from the STI region, to increase the distance between the top surface of the STI region and top surfaces of the first and second fins. A conformal stressor dielectric material is deposited over the fins and STI region. The conformal dielectric stressor material is reflowed, to flow into a space between the first and second fins above a top surface of the STI region, to apply stress to a channel of the finFET.

In some embodiments, a method comprises providing first and second fins of a finFET extending above a semiconductor substrate, with a shallow trench isolation (STI) region therebetween, and a distance between a top surface of the STI region and top surfaces of the first and second fins. A gate electrode is formed over the first and second fins. First and second SiGe fin extensions are formed on top and side surfaces of the first and second fins above the top surface of the STI region. Material is removed from the STI region, to increase the distance between the top surface of the STI region and top surfaces of the first and second fins. A conformal stressor dielectric material is deposited over the fins, the gate electrode and the STI region. The conformal dielectric stressor material is reflowed to flow into a space defined between the first and second fins above a top surface of the STI region, to apply stress to a channel region of the finFET, while leaving a film of the stressor material adjacent the gate electrode to form sidewall spacers. Source and drain regions are implanted after the reflowing.

In some embodiments, a finFET comprises first and second fins extending above a semiconductor substrate, with a shallow trench isolation (STI) region therebetween having an STI dielectric material, and a distance between a top surface of the STI dielectric material and top surfaces of the first and second fins. A gate electrode is provided over the first and second fins. First and second SiGe fin extensions are provided on top and side surfaces of the first and second fins above the top surface of the STI dielectric material. A dielectric stressor material is provided in a space defined between the first and second fins above the top surface of the STI material, for applying stress to a channel region of the finFET. A film of the dielectric stressor material is provided adjacent the gate electrode to form sidewall spacers.

BRIEF DESCRIPTION OF THE DRAWINGS

FIG. 1A is an isometric view of a conventional finFET.

FIG. 1B shows one of the fins of the device of FIG. 1A, after epitaxial SiGe growth.

FIGS. 1C to 1F show the finFET before and after epitaxial SiGe formation on the fins.

FIGS. 2A and 2B show a substrate after fin and gate electrode formation.

FIGS. 3A and 3B show the substrate after LDD implant.

FIGS. 4A and 4B show the substrate after dummy sidewall spacer definition.

FIGS. 5A and 5B show the substrate after epitaxial SiGe fin extension deposition.

FIGS. 6A and 6B show the substrate after reducing the height of the STI dielectric.

FIGS. 7A and 7B show the substrate after depositing a film of a stressor material.

FIGS. 8A and 8B show the substrate after reflowing the stressor material.

FIGS. 9A and 9B show the source/drain implant process.

DETAILED DESCRIPTION

Figure 10:
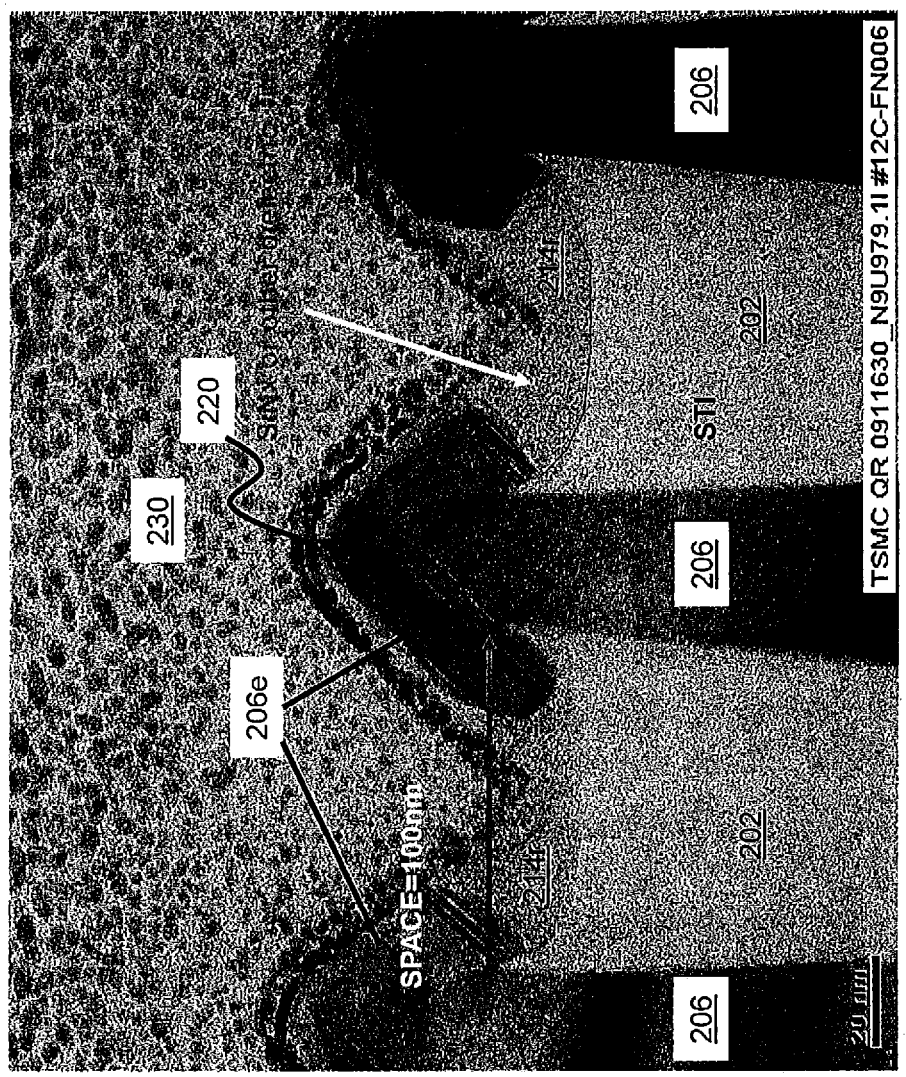
FIG. 10 is a photograph showing an example of the finFET of FIGS. 9A and 9B.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The figures are not drawn to scale.

The inventors have discovered that, for advanced technology nodes (e.g., 22 nm or smaller), the epitaxial SiGe formation on the fins of a finFET narrows the window between the lateral extensions of adjacent fins of the NMOS and PMOS transistors so severely that bridging may occur. This bridging interferes with the ability to singulate the dies. Even without complete bridging, the narrowing of the window between the adjacent fin extensions may cause voids in the first inter metal dielectric (IMD) layer, which is deposited after completion of the active device processing. Such voids can occur in the space beneath and between the adjacent PMOS and NMOS fin extensions.

Other issues that the inventors found to arise in advanced technology designs are low efficiency of selective epitaxy growth technology on a finFET with ultra-narrow fin width (small volume). In some designs (e.g., FinFET with dogbone) it may become more difficult to perform the gate dummy sidewall spacer process.

An example is described herein, in which the SiGe epitaxial layer is formed on the tops of the fins, while the surface of the STI dielectric material is at a first height near the tops of the fins. Because of the reduced distance between the tops of the fins and the top of the STI material, the resulting SiGe film has shorter lateral extensions. As a result, there is less reduction in the window between adjacent fin extensions, and the lateral extensions of adjacent fins do not merge together. After the epitaxial SiGe deposition, the height of the STI dielectric is then lowered to a second height, and a stressor material is applied over the device in the form of a conformal film. The stressor material is reflowed to at least partially fill a space between the fins and above the STI dielectric material. In some embodiments, portions of the conformal film remain adjacent to the gate electrode of the finFET to form sidewall spacers.

FIGS. 2A through 9B show an exemplary integrated method for fabricating a finFET 200. This process permits the channel stress to be increased without requiring additional masks or photo steps. Each pair of adjacent FIGS. 2A and 2B, 3A and 3B, 4A and 4B, 5A and 5B, 6A and 6B, 7A and 7B, 8A and 8B, and 9A and 9B) provides X direction and Y direction views of the finFET at a respective stage of the process. The X and Y directions are the same directions labeled in FIG. 1A.

Referring to FIGS. 2A and 2B, the configuration is shown after forming first and second fins 206 of a finFET 200 extending above a semiconductor substrate 201. A gate dielectric film (not shown) and gate electrode 208 are formed above the fins 206. A hard mask layer 212 is formed above the gate electrode. A shallow trench isolation (STI) region 202 is formed between the fins 206. A first distance 207a is defined between a top surface of the STI region 202 and top surfaces of the first and second fins 206. The first distance 207a is less than the height 107 shown in FIG. 1C by about 15 to 20 nm. That is, the height of the top surface of the STI region 202 is about 15 to 20 nm higher (relative to the top of fins 206) than the height of STI region 102 (relative to the top of fins 106). For example, in some embodiments, the first distance 207a may be about 80 nm (where the corresponding distance 107 in FIG. 1C may be about 100 nm).

Semiconductor substrate may be bulk silicon, bulk silicon germanium (SiGe), or other Group III-V compound substrate. The substrate includes several fins 206 with a plurality of STI regions 202 between respective pairs of the fins 206, although only a single STI 202 region is shown in the drawings.

STI formation typically includes recess formation on the Si substrate and forming a dielectric film using a CVD process, such as a low pressure CVD (LPCVD) or plasma enhanced CVD (PECVD), then using chemical mechanical polishing (CMP) to remove extra STI dielectric film. The STI regions may be filled with TEOS, SiO, SiN or the like. The STI regions may be formed by a variety of processes. In one embodiment, the STI dielectric is deposited by an LPCVD process at a temperature of over 500° C.

FIGS. 3A and 3B show the lightly doped drain (LDD)/pocket implant step 203, which implants a small dosage of dopants into the source drain regions adjacent the channel region. Dopants such as phosphorus, boron or the like may be used. Following the LDD implant, the substrate is annealed.

FIGS. 4A and 4B show the formation of dummy side walls (DSW) 210, 211. Dummy sidewall spacers 210 and 211 may be formed by depositing successive conformal layers of an oxide and a nitride, and using anisotropic etching (e.g., dry etch) to remove the oxide and nitride from all the horizontal surfaces, while keeping both layers on the vertical surfaces adjacent to the gate electrode.

FIGS. 5A and 5B show the deposition of the epitaxial SiGe fin extension layers 206e on the top and side surfaces of the first and second fins 206 above the top surface of the STI region 202. As a result of the relatively smaller second height 207a between the top surface of the STI region 202 and top surfaces of the first and second fins 206, the lateral extensions 206L of the fin extension 206e do not extend horizontally as far towards each other as do the lateral extensions of the fin extensions 106e of FIG. 1D. Thus, the window 206w between the fin extensions 206e is larger than the window 106w between the fin extensions 106e. Then, the DSW layer 211 is removed, and thus is not shown in FIGS. 5A and 5B.

FIGS. 6A and 6B show a process for removing material from the STI region 202, to increase the distance between the top surface of the STI region 202 and top surfaces of the first and second fins 206 from the first distance 207a to a second distance 207b, which is about 15 to 20 nm greater than the first distance 207a. In some embodiments, the STI dielectric material is removed by dipping the substrate in a dilute hydrogen fluoride (HF) solution. Other alternative etchants may be used to selectively remove a portion of the STI dielectric without etching the gate structure or the SiGe extensions 206e. The step of removing material from the STI region 202 includes lowering the top surface of the STI region by a distance (H1-H2) below bottoms 206eb of the fin extensions 206e.

FIGS. 7A and 7B show a process for depositing a conformal stressor dielectric material 214 over the fins 206 and the STI region 202, and the gate electrode of the finFET 200. A stressor dielectric material 214 has a lattice spacing that differs sufficiently from the underlying STI dielectric material 202, so as to cause a compressive or tensile stress on the channel. For example, in the example of a PMOS transistor, it is desirable to use a stressor material such as SiNx, to cause a compressive stress. In other embodiments, in an NMOS transistor, a stressor material may be used to place the channel in tensile stress. A layer of SiOx may be applied to create tensile stress in an NMOS. The stressor film may be deposited by a variety of isotropic methods, including atomic layer deposition (ALD), chemical vapor deposition (CVD), low pressure CVD (LPCVD), plasma enhanced CVD (PECVD), or the like. In the example of FIGS. 7A and 7B, the stressor material 214 is a silicon nitride film deposited by PECVD. The thickness T1 of the stressor material film 214 at the time of deposition is selected so that after the reflowing step shown in FIGS. 8A and 8B, the stressor material 214r over the STI region 202 has a desired thickness T2 to impart a desired amount of stress. For example, the thickness T1 of the conformal film 214 to be deposited may be approximated by:

$$T1=T2*(A2/A1),$$

where T1 is the thickness of the conformal film deposited,
T2 is the desired final thickness of the stressor film,
A2 is the surface area of the STI regions, and
A1 is the horizontal surface area over which the conformal film 214 is initially deposited.

FIGS. 8A and 8B show the process of reflowing the conformal dielectric stressor material 214 to flow into a space between the first and second fins 206 above a top surface of the STI region 202, forming a stressor layer 214r to apply stress to a channel of the finFET. In some embodiments, the reflowing step leaves a vertical film 214s of the stressor material adjacent the gate electrode 208 to form sidewall spacers. With the layer of reflowed stressor material 214r (e.g., SiNx) on the top surface of the STI dielectric (e.g., SiOx) 202, a compressive stress from about 1 GPa to about 3 GPa to contact etch stop layer (CESL) is achieved. In some embodiments, the compressive stress to the CESL is tuned to be within the range from 1.5 GPa to about 3 GPa. In some embodiments, the stress is about 2.3 GPa. The distances T3 and T4 (recess depth) shown in FIG. 8A are variables discussed below in the description of FIGS. 11 and 12.

In some embodiments, the stressor material 214, which has been deposited by PECVD, can be reflowed by heating the substrate to about 300° C. In other embodiments, the reflowing is achieved by an anisotropic plasma etching step. The reflowing step includes flowing a sufficient amount of the stressor material 214 from the top of the fin OD 206 and the hard mask 212 into the space between fins 206 and above the STI region 202 to at least partially fill the space to a height T2 above the bottoms of the fin extensions 206e.

FIGS. 9A and 9B show the process of performing source and drain dopant implantation 217 after forming the sidewall spacers 214s.

FIG. 10 is a photograph showing an example of finFETs formed according to the method described above. The contact etch stop layer (CESL) 220 and the interlayer dielectric (ILD) 230 are also shown. With the top surface of the STI dielectric regions 202 about 100 nm across, the fin SiGe extensions 206e have an ample window between adjacent fin extensions to avoid formation of voids in the overlying interlayer dielectric 230 between and beneath the extensions 206e. The window between fin extensions is also sufficient to facilitate singulation.

Figure 11:
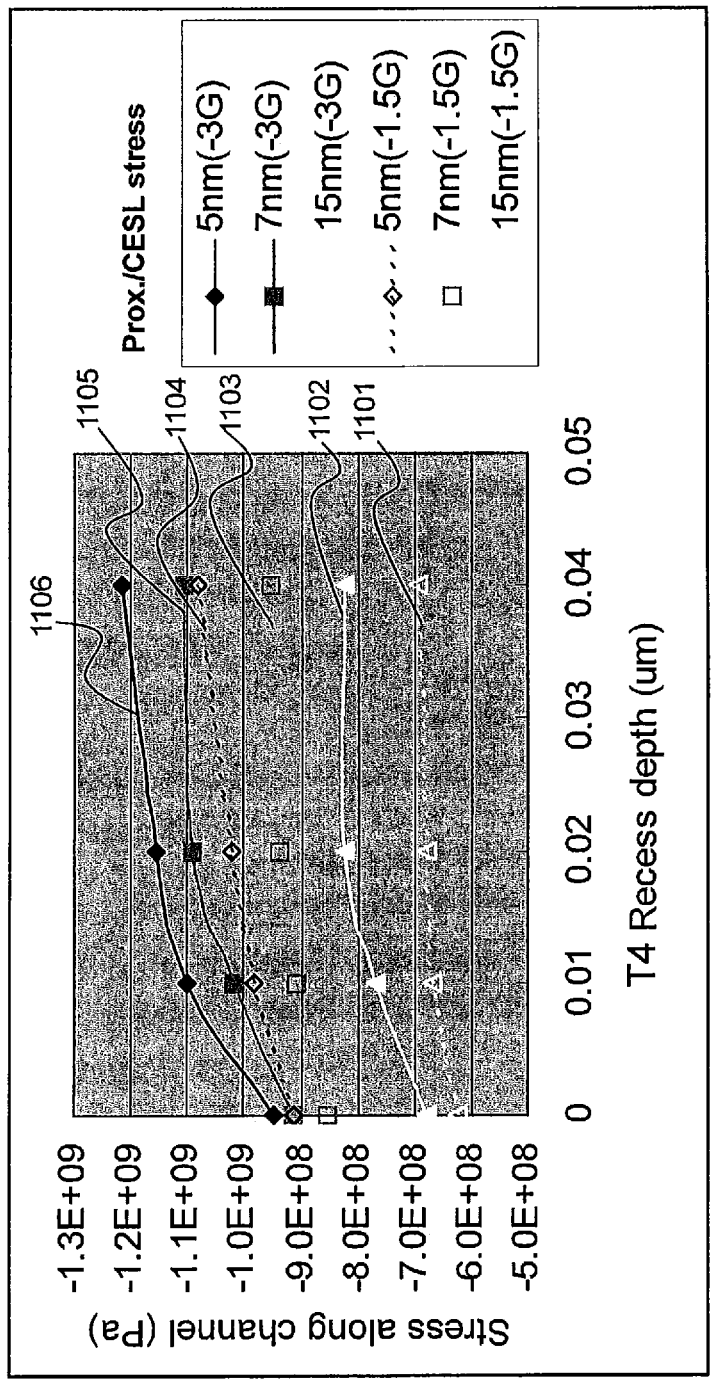
FIG. 11 is a diagram of channel stress as a function of various parameters.
Figure 12:
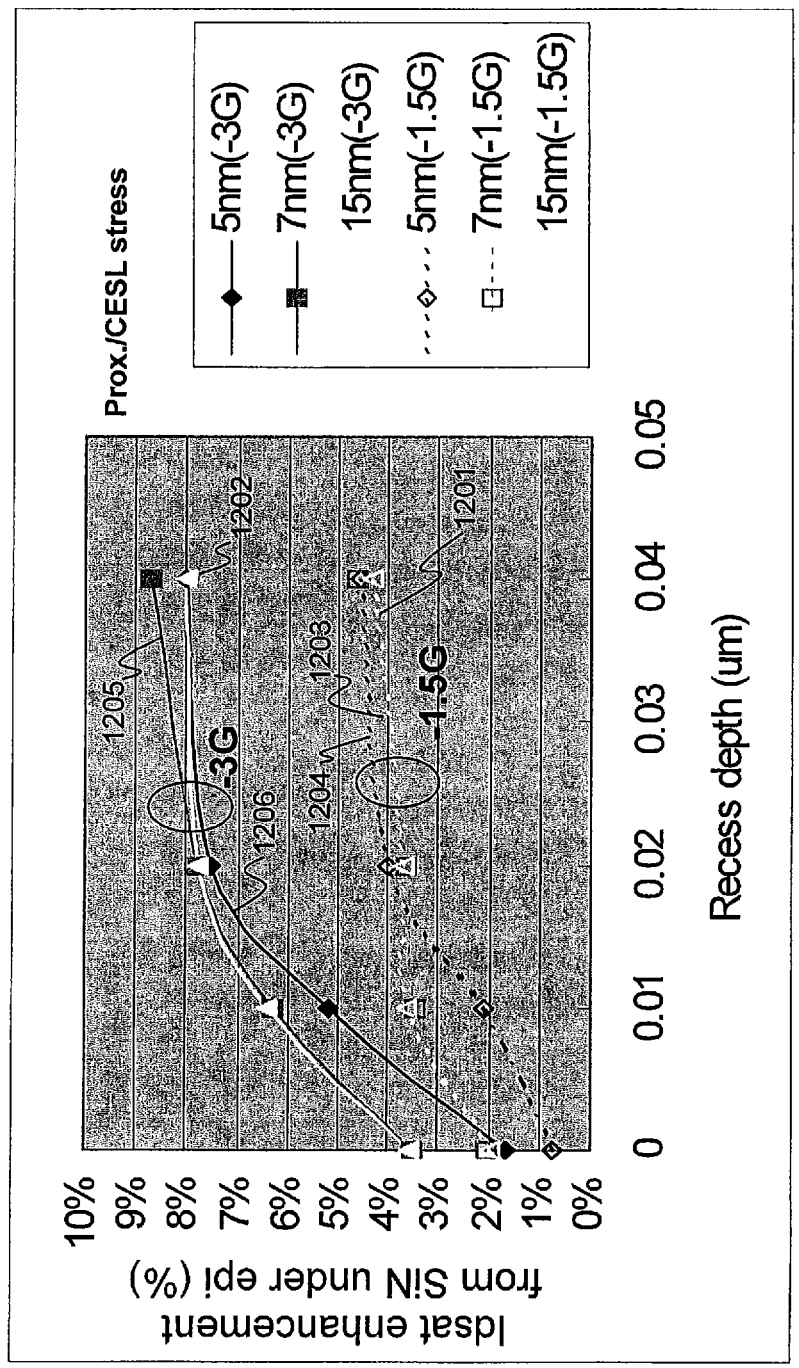
FIG. 12 is a diagram of Idsat gain for the cases shown in FIG. 11.

FIGS. 11 AND 12 are based on simulation data which used the dimensions described herein. FIG. 11 shows the channel stress as a function of the stressor film thickness T3 above the bottom of the SiGe fin extensions, and the thickness T4 of the stressor material below the bottom of the SiGe extensions (corresponding to the thickness of STI dielectric removed in FIGS. 6A and 6B). Curve 1101 shows the channel stress of a finFET as a function of the recess depth T4 (FIGS. 8A, 9A) with a stressor film having T3=15 nm with 1.5 GPa of stress. Curve 1102 shows the channel stress of a finFET as a function of the recess depth T4 with a stressor film having T3=15 nm with 3 GPa of stress. Curve 1103 shows the channel stress of a finFET as a function of the recess depth T4 with a stressor film having T3=7 nm with 1.5 GPa of stress. Curve 1104 shows the channel stress of a finFET as a function of the recess depth T4 with a stressor film having T3=5 nm with 1.5 GPa of stress. Curve 1105 shows the channel stress of a finFET as a function of the recess depth T4 with a stressor film having T3=7 nm with 3 GPa of stress. Curve 1106 shows the channel stress of a finFET as a function of the recess depth T4 with a stressor film having T3=5 nm with 3 GPa of stress.

FIG. 12 shows the PMOS Idsat enhancement for the six cases shown in FIG. 11. The symbols for curves 1201-1206 are the same as the symbols in respective curves 1101-1106. Curve 1201 shows the Idsat change for a finFET as a function of the recess depth T4 with a stressor film having T3=15 nm and CESL stress of 1.5 GPa. Curve 1202 shows the Idsat change of a finFET as a function of the recess depth T4 with a stressor film having T3=15 nm with 3 GPa of stress. Curve 1203 shows the Idsat change of a finFET as a function of the recess depth T4 with a stressor film having T3=7 nm with 1.5 GPa of stress. Curve 1204 shows the Idsat change of a finFET as a function of the recess depth T4 with a stressor film having T3=5 nm with 1.5 GPa of stress. Curve 1205 shows the Idsat change of a finFET as a function of the recess depth T4 with a stressor film having T3=7 nm with 3 GPa of stress. Curve 1206 shows the Idsat change of a finFET as a function of the recess depth T4 with a stressor film having T3=5 nm with 3 GPa of stress. The curves 1202, 1205 and 1206 show that with a CESL compressive stress of 3 GPa and a recess depth T4 of about 20 nm, an 8% Idsat improvement should be attainable.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A semiconductor device comprising:
    a first fin and a second fin extending from a substrate and above a dielectric material;
    a first epitaxial feature over an upper portion of the first fin;
    a second epitaxial feature over an upper portion of the second fin; and
    a dielectric stressor material between the first epitaxial feature and the second epitaxial feature,
    wherein the dielectric stressor material is along a bottommost side of the first epitaxial feature and a bottommost side of the second epitaxial feature.

2. The semiconductor device of claim 1, wherein a topmost surface of the dielectric stressor material is below at least one of: an uppermost tip of the first epitaxial feature and an uppermost tip of the second epitaxial feature.

3. The semiconductor device of claim 1, further comprising:
    a contact etch stop layer over the first epitaxial feature, the second epitaxial feature, and the dielectric stressor material.

4. The semiconductor device of claim 3, wherein the dielectric stressor material applies a compressive stress in a range from about 1 GPa to about 3 GPa to the contact etch stop layer.

5. The semiconductor device of claim 1, wherein the dielectric stressor material is capable of being reflowed.

6. The semiconductor device of claim 1, wherein the dielectric stressor material comprises at least one of: a silicon nitride and a silicon oxide.

7. The semiconductor device of claim 1, further comprising:
    a gate electrode over the first and second fins.

8. The semiconductor device of claim 7, further comprising:
    sidewall spacers adjacent the gate electrode, the sidewall spacers comprising a film of the dielectric stressor material.

9. The semiconductor device of claim 1, wherein a topmost surface of the dielectric material extends to contact a side of the first fin and a side of the second fin.

10. The semiconductor device of claim 1, wherein each of the first and second epitaxial features slopes downward toward the substrate and away from the respective fin over which that epitaxial feature is formed.

11. The semiconductor device of claim 1, wherein a bottommost edge of each of the first and second epitaxial features is located a non-zero distance above a topmost surface of the dielectric material.

12. The semiconductor device of claim 1, wherein a distance between a topmost surface of the dielectric material and a bottom of the first and second epitaxial features on side surfaces of the first and second fins is in a range from 5 nm to 15 nm.

13. A semiconductor device comprising:
    a substrate including first and second fins extending above a shallow trench isolation (STI) dielectric material;
    a first fin extension over a topmost surface and a side surface of the first fin;
    a second fin extension over a topmost surface and a side surface of the second fin, wherein the first fin extension and the second fin extension extend laterally above the STI dielectric material; and
    a nitrogen (N)-containing material in contact with the first fin extension, the second fin extension and the STI dielectric material,
    wherein a topmost surface of the N-containing material is below an uppermost tip of the first fin extension.

14. The semiconductor device of claim 13, wherein the topmost surface of the N-containing material is below an uppermost tip of the second fin extension.

15. The semiconductor device of claim 13, wherein the N-containing material applies a compressive stress of about 1.5 GPa to about 3 GPa to a contact etch stop layer over the first and second fin extensions.

16. A semiconductor device comprising:
    a first epitaxial extension over an upper portion of a first fin, wherein the first epitaxial extension includes a lower side directed away from the first fin and an upper side directed close to the first fin, wherein the lower side of the first epitaxial extension is between a dielectric material and the upper side of the first epitaxial extension;
    a second epitaxial extension over an upper portion of a second fin, wherein the second epitaxial extension includes a lower side directed away from the second fin and an upper side directed close to the second fin; and
    a stressor in a recess defined by the lower side of the first epitaxial extension, the lower side of the second epitaxial extension and the dielectric material, wherein the stressor is in contact with at least two of the first fin, the second fin and the dielectric material.

17. The semiconductor device of claim 16, wherein the semiconductor device is a fin field effect transistor.

18. The semiconductor device of claim 16, wherein the first and second epitaxial extensions comprise SiGe.

19. The semiconductor device of claim 16, further comprising:
    a contact etch stop layer over at least two of the first epitaxial extension, the second epitaxial extension, and the stressor.

20. The semiconductor device of claim 19, further comprising:
    an interlayer dielectric material over the contact etch stop layer.

* * * * *